(12) United States Patent
Yeh et al.

(10) Patent No.: US 7,245,467 B2
(45) Date of Patent: Jul. 17, 2007

(54) ESD PROTECTION CIRCUIT BETWEEN DIFFERENT VOLTAGE SOURCES

(75) Inventors: Ta-Hsun Yeh, Hsinchu (TW); Yung-Hao Lin, Miaoli Hsien (TW); Yuh-Sheng Jean, Dapi Township, Yunlin County (TW)

(73) Assignee: Realtek Semiconductor Corp., Hsinchu (TW)

( * ) Notice: Subject to any disclaimer, the term of this patent is extended or adjusted under 35 U.S.C. 154(b) by 337 days.

(21) Appl. No.: 10/964,392

(22) Filed: Oct. 13, 2004

(65) Prior Publication Data

US 2005/0083623 A1 Apr. 21, 2005

(30) Foreign Application Priority Data

Oct. 14, 2003 (TW) .............................. 92128358 A

(51) Int. Cl.
*H02H 9/00* (2006.01)
(52) U.S. Cl. ........................................................ 361/56
(58) Field of Classification Search ................ 361/56, 361/111
See application file for complete search history.

(56) References Cited

U.S. PATENT DOCUMENTS

| | | | |
|---|---|---|---|
| 5,598,093 A * | 1/1997 | Acatrinei | 323/299 |
| 5,744,842 A | 4/1998 | Ker | |
| 5,804,861 A * | 9/1998 | Leach | 257/362 |
| 6,011,681 A * | 1/2000 | Ker et al. | 361/111 |
| 6,028,758 A | 2/2000 | Sharpe-Geisler | |
| 6,399,990 B1 | 6/2002 | Brennan et al. | |
| 6,670,676 B1 * | 12/2003 | Rahim | 257/355 |
| 6,720,623 B2 * | 4/2004 | Chen | 257/355 |
| 6,947,267 B2 * | 9/2005 | Liu et al. | 361/56 |
| 7,087,968 B1 * | 8/2006 | Lai et al. | 257/355 |
| 7,110,228 B2 * | 9/2006 | Chang | 361/56 |
| 2001/0043449 A1 | 11/2001 | Okushima | |
| 2006/0189189 A1 * | 8/2006 | Jeon | 439/248 |

* cited by examiner

*Primary Examiner*—Michael Sherry
*Assistant Examiner*—Boris Benenson
(74) *Attorney, Agent, or Firm*—Thomas, Kayden, Horstemeyer & Risley

(57) ABSTRACT

An ESD protection circuit for hybrid voltage sources includes a first bipolar transistor set and a second bipolar transistor set, a first detection circuit, and a second detection circuit. The ON/OFF states of the first bipolar transistor set and the second bipolar transistor set are determined by the first and the second detection circuit, and the ON/OFF states function to isolate terminals of the different voltage sources and discharge electrostatic charges injected into one of the terminals.

19 Claims, 6 Drawing Sheets

ESD PROTECTION CIRCUIT BETWEEN DIFFERENT VOLTAGE SOURCES

This application claims the benefit of Taiwan application Ser. No. 092128358, filed Oct. 14, 2003, the subject matter of which is incorporated herein by reference.

BACKGROUND OF THE INVENTION

1. Field of the Invention

The invention relates to an ESD (Electrostatic Discharge) protection circuit, and more particularly to an ESD protection circuit for internal circuits using different voltage sources.

2. Description of the Related Art

An ESD (Electrostatic Discharge) protection circuit often applied in an integrated circuit. Owing to the large voltage of electrostatic charge, the integrated circuit must utilize the ESD protection circuit to prevent the electrostatic charge from damaging internal circuits of the integrated circuit.

However, with the evolution of the technology, different voltage sources are used for the different internal circuits of the integrated circuit. Therefore, the ESD protection circuit is not only disposed between signal input and output bonding pads of the internal circuits, but also disposed between different voltage sources in the integrated circuit. The invention is disclosed with respect to this condition.

FIG. 1 is a schematic illustration showing a conventional ESD protection circuit for internal circuits with different voltage sources. Referring to FIG. 1, the integrated circuit 100 includes an internal circuit 110 using a voltage source with two voltage terminals VDD1 and VSS1, and an internal circuit 120 using another voltage source with two voltage terminals VDD2 and VSS2. Besides, the output signal 121 of the internal circuit 110 can be inputted to the internal circuit 120 through inverters 123 and 125 which are used as the interface circuits for the internal circuits 110 and 120.

The ESD protection mechanism for the integrated circuit 100 is implemented by using ESD clamp circuits 130 and 140 and ESD protection circuits 150 and 160 as shown in the FIG. 1.

For example, when the ESD occurs between the VDD1 and the VSS2, the large ESD current may flow from the VDD1 to the VSS2, or from the VSS2 to the VDD1. In order to prevent the large ESD current from damaging the internal circuits 110 and 120 or the inverters 123 and 125, the clamp circuits 130 and 140 are turned on to discharge the ESD current. Therefore, the large current $I_1$ may be discharged along the path P1 and path P2. That is, the ESD current may be discharged to VSS2 through diodes 151 and 153 of the ESD protection circuit 150 and the clamp circuit 130, and may be discharged to VSS2 through the clamp circuit 140 and the substrate resistor Rs of the ESD protection circuit 160.

Similarly, when the ESD occurs between the VDD2 and the VSS1, the large ESD current may be discharged from the VDD2 to the VSS1 through the ESD protection circuit 150 and ESD claim circuit 140, or through the ESD protection circuit 160 and the ESD clamp circuits 130. So, the large ESD currents may be discharged without damaging the internal circuits 110 and 120 or the inverter 123 and 125.

In addition, the ESD protection circuit 150 is not only for providing discharging path, but also for isolating the two voltage terminals VDD1 and VDD2 from each other. Thus, the two internal circuits 110 and 120 can independently use their own voltage sources during the absence of the electrostatic charge. Therefore, the ESD protection circuit 150 must have a predetermined threshold voltage to effectively isolate the two voltage terminals VDD1 and VDD2 from each other.

Hence, the voltage drop of the two serially connected diodes 151 and 153 being forward conducted has to be larger than the voltage difference between the VDD1 and the VDD2. For instance, if the voltage of the VDD1 is 1.8V and the voltage of the VDD2 is 3.3V, the voltage drop of the serially connected diodes 151 and 153 being forward conducted has to be larger than 1.5V.

In addition, when the voltage difference between the VDD1 and the VDD2 becomes larger, the number of the serially connected diodes of the ESD protection circuit 150 also has to be correspondingly increased in order to effectively isolate the VDD1 and the VDD2 from each other.

FIG. 2 is a schematic illustration showing another conventional ESD protection circuit for an integrated circuit using hybrid voltage sources. As shown in FIG. 2, when the voltage difference between the voltage sources VDD3 and VDD4 is increased, the number of serially connected diodes in the ESD protection circuit 230 should be correspondingly increased. The diodes in the ESD protection circuit are formed based on PMOS or NMOS transistors (not shown). However, the diode of the conventional ESD protection circuit causes the following drawbacks.

1. The diode has a higher leakage current and a lower breakdown voltage, and cannot effective isolate two independent voltage sources from each other.

2. The capability of the diode for driving current is not very good, and thus the current caused by the ESD cannot be discharged quickly.

3. The parasitic capacitance of the diode coupled between two independent powers is larger, and tends to affect the signal between the two internal circuits.

In view of this, the invention proposes an ESD protection circuit to solve the above-mentioned problems.

SUMMARY OF THE INVENTION

It is therefore an object of the invention to provide an ESD protection circuit for an IC utilizing different voltage sources. The ESD protection circuit includes a first bipolar transistor set, a second bipolar transistor set, a first detection circuit and a second detection circuit. The first bipolar transistor set comprises a first bipolar transistor and a second bipolar transistor. The collector of the first bipolar transistor and the emitter of the second bipolar transistor are coupled to a voltage terminal VDD1. The emitter of the first bipolar transistor and the collector of the second bipolar transistor are coupled to another voltage terminal VDD2.

The second bipolar transistor set comprises a third bipolar transistor and a fourth bipolar transistor. The collector of the third bipolar transistor and the emitter of the fourth bipolar transistor are coupled to a voltage terminal VSS1. The emitter of the third bipolar transistor and the collector of the fourth bipolar transistor are coupled to another voltage terminal VSS2.

The first detection circuit has a first connection terminal, a second connection terminal, and a trigger terminal. The first connection terminal of the first detection circuit is coupled to the VDD1, the second connection terminal of the first detection circuit is coupled to the VSS1, and the trigger terminal of the first detection circuit is respectively coupled to the bases of the first and the third bipolar transistors.

Similarly, the second detection circuit has a first connection terminal, a second connection terminal and a trigger terminal. The first connection terminal of the second detection circuit is coupled to the VDD2, the second connection terminal of the second detection circuit is coupled to the VSS2, and the trigger terminal of the second detection circuit is respectively coupled to the bases of the second and the fourth bipolar transistors.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
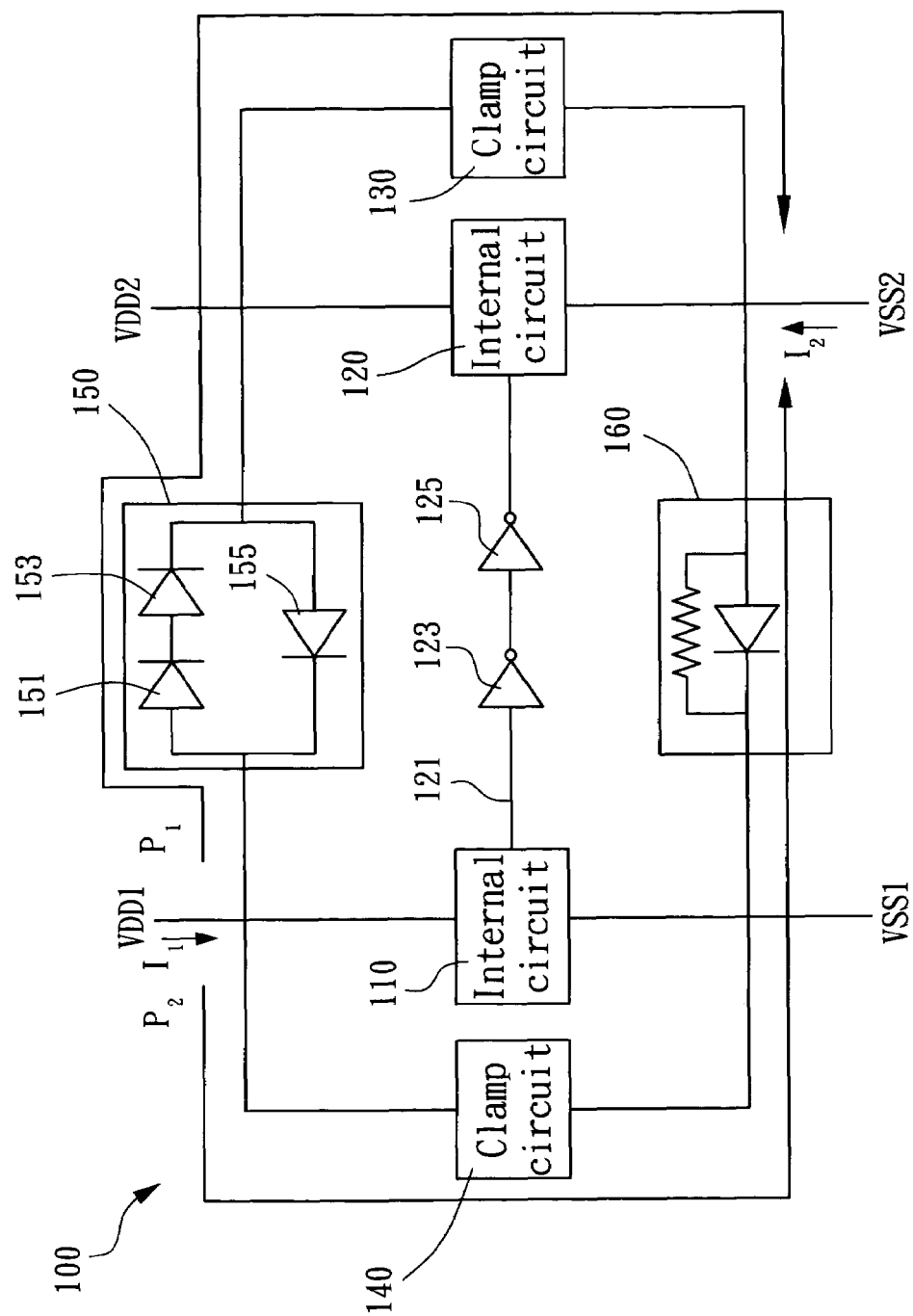
FIG. 1 is a schematic illustration showing a conventional ESD protection circuit for an IC using different voltage sources.
Figure 2:
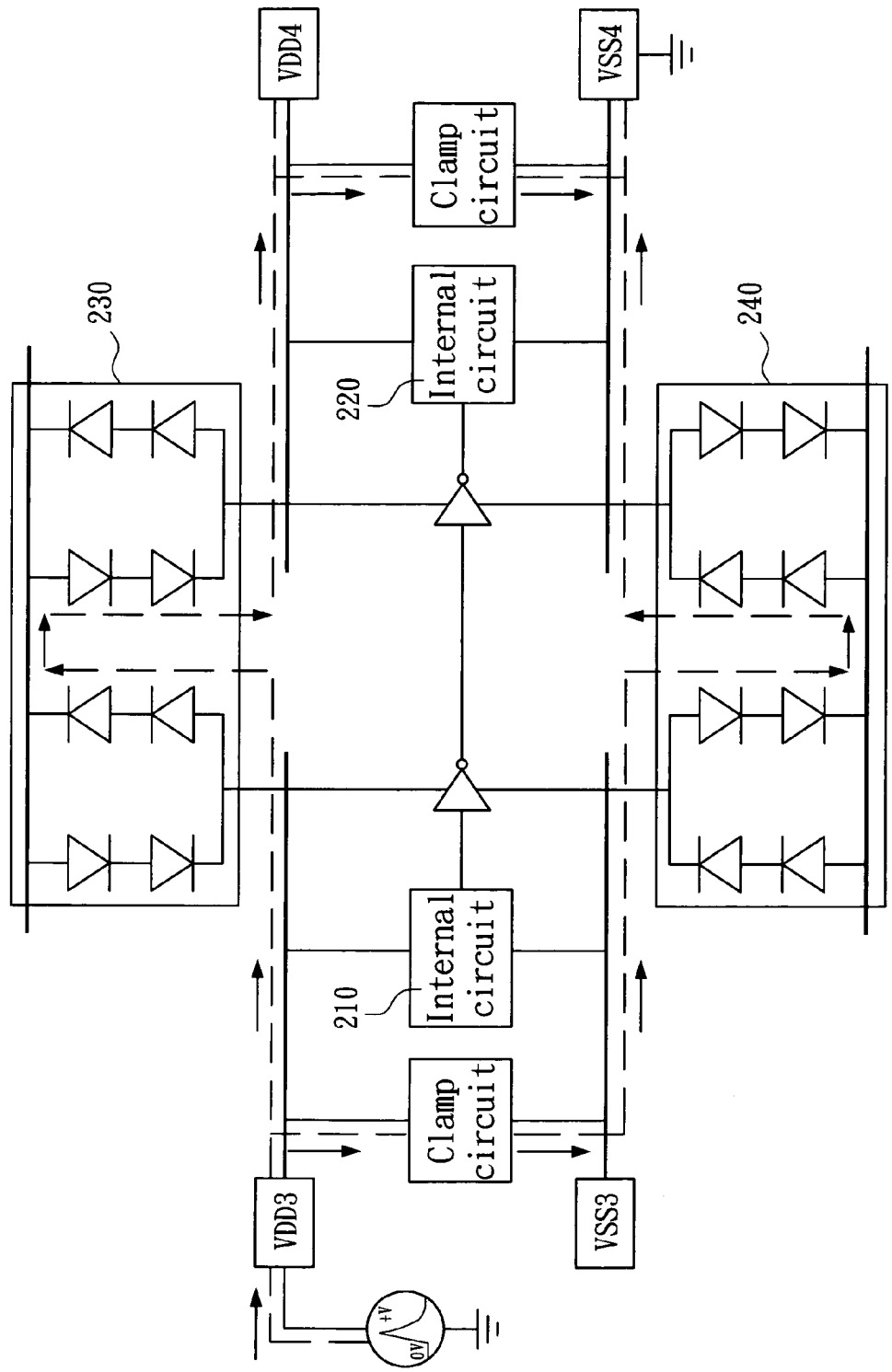
FIG. 2 is a schematic illustration showing another conventional ESD protection circuit for an integrated circuit using hybrid voltage sources.
Figure 3:
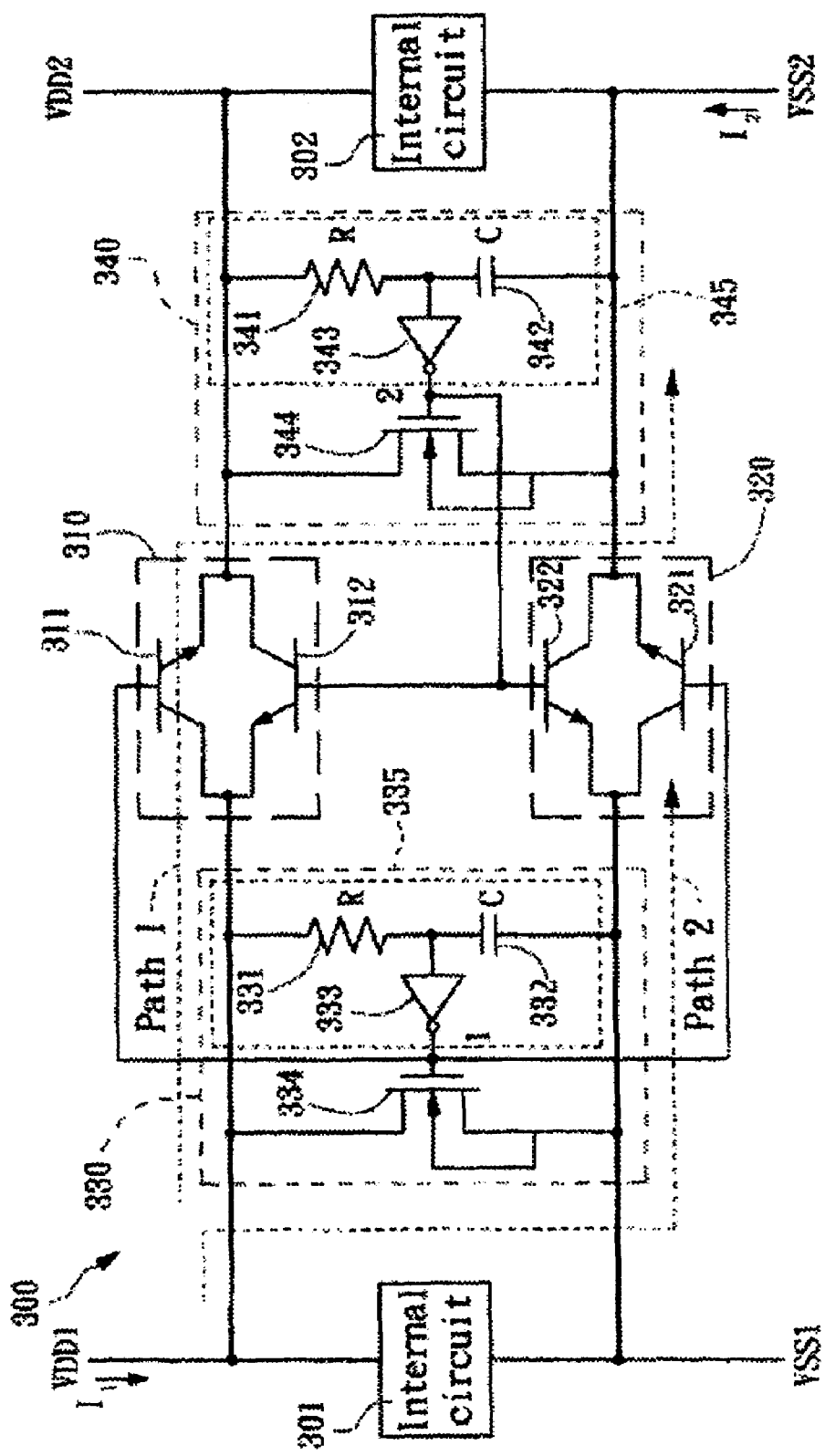
FIG. 3 is a schematic illustration showing an ESD protection circuit according to an embodiment of the invention.
Figure 5:
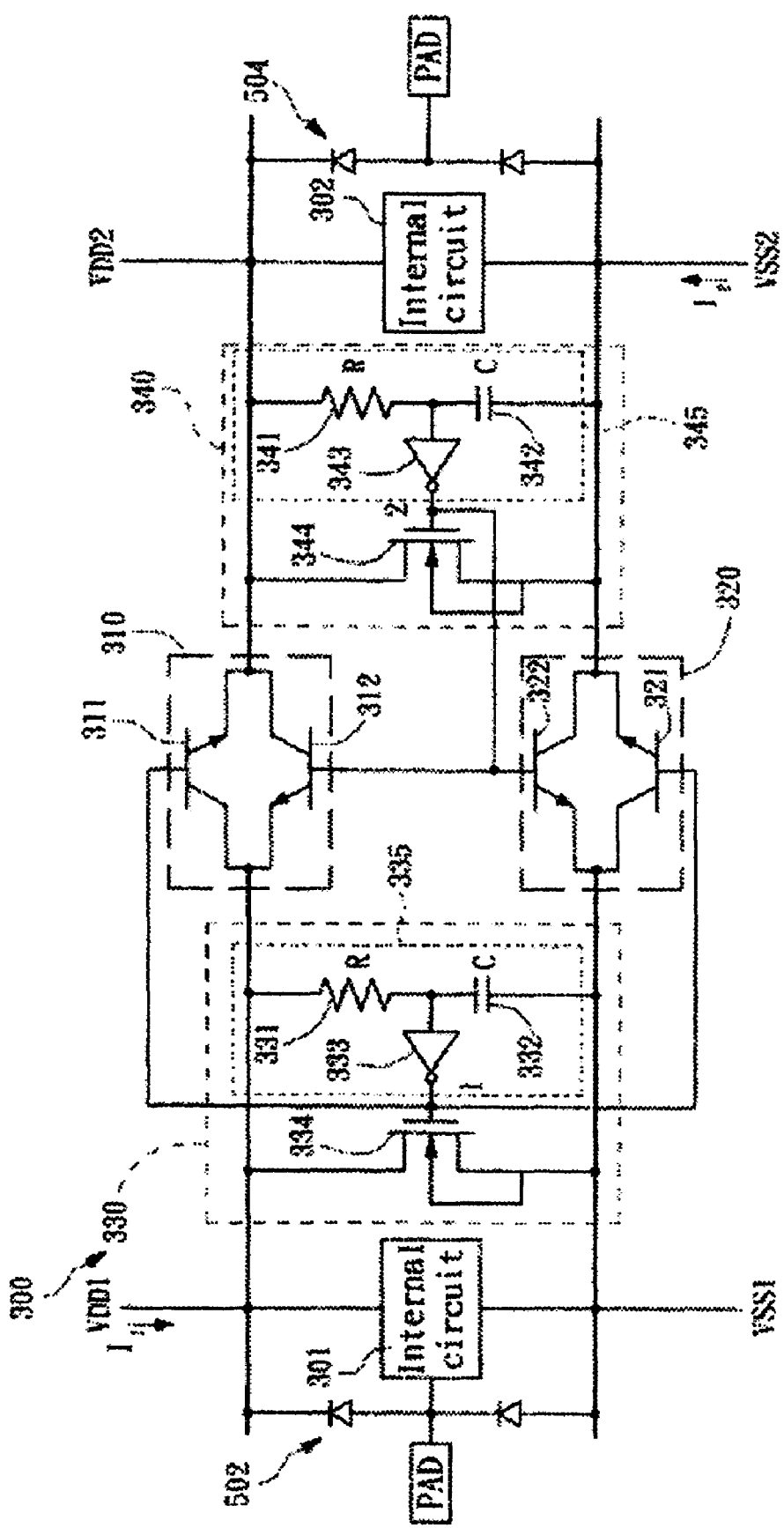
FIG. 5 is a schematic illustration showing an ESD protection circuit constructed in accordance with another embodiment of the invention.

FIG. 3 is a schematic illustration showing an ESD protection circuit according to an embodiment of the invention. As shown in FIG. 3, the ESD protection mechanism in the integrated circuit 300 is implemented by using ESD detecting circuits 330 and 340 and ESD protection circuits 310 and 320, wherein the ESD detecting circuit 330 is coupled between power source terminals VDD1 and VSS1, the ESD detecting circuit 340 is coupled between power source terminals VDD2 and VSS2, the ESD protection circuit 310 is coupled between the VDD1 and the VDD2, and the ESD protection circuit 320 is coupled between the VSS1 and the VSS2. Besides, at least a first diode 502 (as shown in FIG. 5) may be connected between the VDD1 and the VSS1 for providing a discharging path from the VSS1 to the VDD1, and a second diode 504 (as shown in FIG. 5) may be connected between the VDD2 and the VSS2 for providing a discharging path from the VSS2 to the VDD2.

The ESD protection circuits 310 and 320 are implemented by the first transistor set 310 and the second transistor set 320 respectively, for example. The first transistor set 310 comprises two NPN bipolar transistors 311 and 312, and the second transistor set 320 comprises two NPN bipolar transistors 321 and 322, wherein the bipolar transistors 311, 312, 321, and 322 can be replaced by other kinds of transistors such as metal oxide semiconductor field effect transistors (MOSFETs). The ESD detecting circuit 330 mainly comprises a discharging circuit 334 and a first detector 335, and the ESD detecting circuit 340 comprises a discharging circuit 344 and a second detector 345. The discharging circuit 334 is implemented by NMOS 334, for example, and the discharging circuit 344 is implemented by NMOS 344. The first detector 335 comprises a resistor 331, a capacitor 332, and an inverter 333, and the second detector 345 comprises a resistor 341, a capacitor 342 and an inverter 343. Note that the implementation of the ESD detecting circuit 330 or 340 is not limited by this embodiment.

In the normal condition which means the electrostatic charge is absent at the voltage terminals VDD1 and VDD2, the capacitor 332 works as a open circuit and the voltage at the input end of the inverter 333 is the same as the voltage at the VDD1 (assumed to be a high-level voltage 1.8 volts). Thus, the inverter 333 inverts the high-level voltage and outputs a low-level voltage to node 1 such that the NMOS transistor 334 is kept off.

Similarly, in the normal condition, the capacitor 342 works as a open circuit and the voltage at the input end of the inverter 343 is the same as the voltage at the VDD2 (assumed to be a high level voltage 3.3 volts). The inverter 343 inverts the high-level voltage and outputs a low-level voltage such that the NMOS transistor 344 is kept off.

Meanwhile, the inverter 333 outputs the low-level voltage to the base of the bipolar transistor 311 and the base of the bipolar transistor 321. Thus, the bipolar transistors 311 and 321 are kept OFF because the low-level voltage at node 1 is not high enough to turn on the bipolar transistors 311 and 321.

In addition, the inverter 343 outputs the low-level voltage to the base of the bipolar transistor 312 and the base of the bipolar transistor 322. Therefore, the bipolar transistors 312 and 322 are also kept OFF because the low-level voltage at node 2 is not high enough to turn on the bipolar transistors 312 and 322.

Furthermore, the NPN junction structures of the bipolar transistors 311, 312, 321, and 322 have the properties of low leakage current and high breakdown voltage.

Consequently, in the normal condition, the first transistor set 310 and the second transistor set 320 are OFF, so the voltage terminals VDD1 and VDD2 are effectively isolated from each other.

When the electrostatic charge injected into the VDD1, VDD2, VSS1, or VSS2, the ESD current may be discharged from the VDD1 to the VSS2, from the VSS2 to the VDD1, from the VDD2 to the VSS1, or from the VSS1 to the VDD2.

When the electrostatic voltage is a positive large pulse injected into the VDD1, the large ESD current $I_1$ may flows from the VDD1 to the VSS2. Meanwhile, the capacitor 332 and the capacitor 342 work as short circuit corresponding to the transient electrostatic voltage, and the voltages at the input ends of the inverters 333 and 343 are respectively pulled down to the low-level voltages at VSS1 and VSS2. Consequently, the inverters 333 and 343 respectively invert the low-level voltages into high-level voltages for output. That is, the voltages at nodes 1 and 2 are high-level voltages and thus the bipolar transistors 311, 321, 312, and 322 are turned on.

Thus, the large ESD current $I_1$ may be discharged along path 1 (from the VDD1 to the VSS2 through the bipolar transistor 311 and the NMOS transistor 344) and path 2 (from the VDD1 to the VSS2 through the NMOS transistor 334 and the bipolar transistor 321).

Similarly, when the ESD is a positive large pulse injected into the VDD2, the large ESD current may be discharged from the VDD2 to the VSS1 through the bipolar transistor 312 and the NMOS transistor 334, and from the VDD2 to the VSS1 through the NMOS transistor 344 and the bipolar transistor 322).

In addition, the NPN bipolar transistors 311, 312, 321 and 322 enable the ESD protection mechanism to have the higher capability for driving current (i.e., the higher capability for discharging the ESD current).

In the preferred embodiment of the invention, the practical structures of the first and the second transistor set 310, 320 also can be implemented by using the typical CMOS triple well process. It means that BJT or BiCMOS technology is not necessary for implementing the present invention and thus the complication of the process is reduced. Explanation will be made by taking the structure of the first transistor set 310 as an example with reference to FIG. 4A.

Figure 4A:
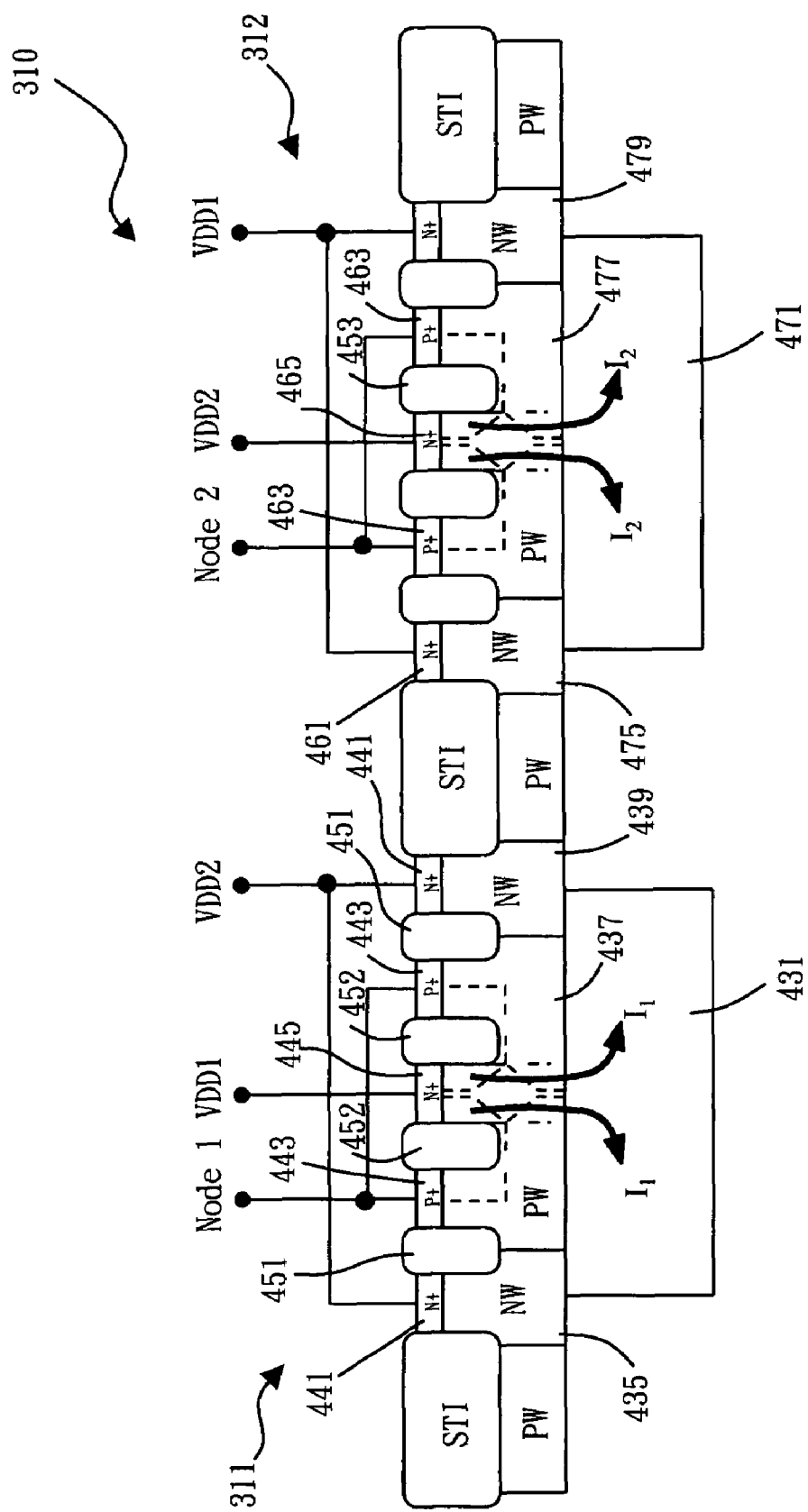
FIG. 4A is a schematic illustration showing a first transistor set structure according to an embodiment of the invention.

FIG. 4A is a schematic illustration showing the structure of the first transistor set 310 according to an embodiment of the invention. In FIG. 4A, the structure of the bipolar transistor 311 includes a P-well 437, a deep N-well 431, an N-well 435 and an N-well 439 adjacent to the P-well 437. The N+ region 441, the P+ region 443, the N+ region 445, the P+ region 443 and the N+ region 441 are respectively disposed on the N-well 435, the P-well 437 and the N-well 439. These ion implantation regions are isolated from each other by STI (shallow trench isolation) structures 451 and 452.

Accordingly, the N+ ion implantation region 445 is the collector of the bipolar transistor 311 and is coupled to the voltage source VDD1 of FIG. 3, the P+ ion implantation regions 443 is the base of the bipolar transistor 311 and is coupled to the node 1 of FIG. 3, and the N+ ion implantation regions 441 is the emitter of the bipolar transistor 311 and is coupled to the voltage source VDD2 of FIG. 3.

Therefore, when the ESD current $I_1$ of FIG. 3 is discharged from the collector of the bipolar transistor 311 to the emitter thereof, the current $I_1$ flows from the P-well 437 into the N-wells 435 and 439 through the deep N-well 431.

Similarly, the N+ region 465 is the collector of the bipolar transistor 312 of FIG. 3 and is coupled to the voltage source VDD2 of FIG. 3. The P+ region 463 is the base of the bipolar transistor 312 and coupled to the node 2 of FIG. 3. The N+ region 461 is the emitter of the bipolar transistor 312 and coupled to the voltage source VDD1 of FIG. 3. When the ESD current $I_2$ of FIG. 3 is discharged from the collector to the emitter of the bipolar transistor 312, the current $I_2$ flows from the P-well 477 into the N-wells 475 and 479 through the deep N-well 471.

Figure 4B:
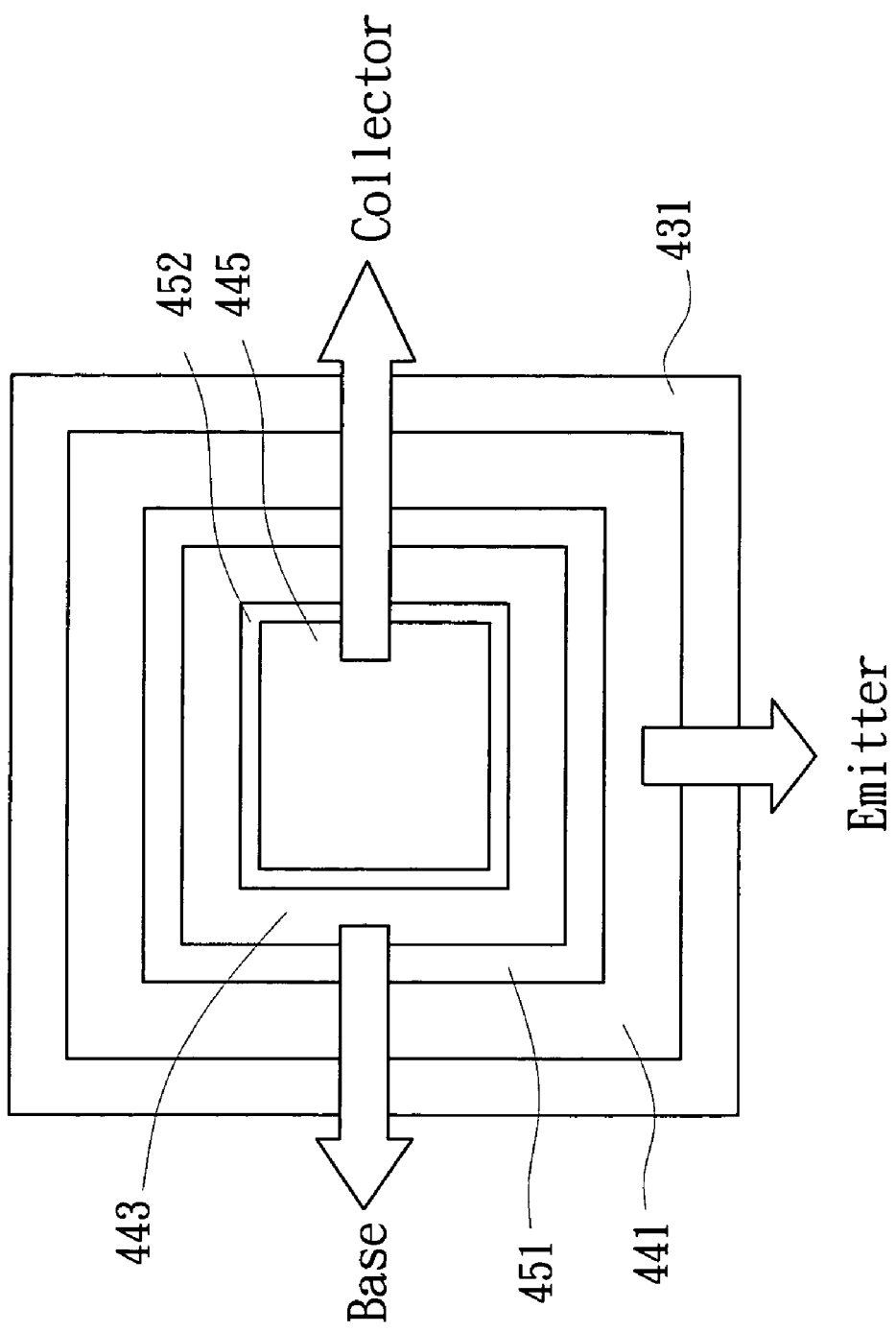
FIG. 4B is a top view showing the first transistor set structure of FIG. 4A.

In addition, in the embodiment of the invention, the ring structure formed by the triple well process is also helpful for discharging the ESD currents $I_1$ and $I_2$. FIG. 4B is a top view showing the first transistor set 310 structure of FIG. 4A. As shown in FIG. 4B, the isolation structure 452 of FIG. 4A surrounds the N+ region 445. Similarly, the P+ region 443 surrounds the isolation structure 452. The isolation structure 451 also surrounds the P+ region 443. Similarly, the N+ region 441 also surrounds the isolation structure 451. The circumference of the deep N-well 431 also surrounds the circumference of the N+ region 445.

Because the first transistor set 310 may be formed as the ring structure, the bipolar transistor 311 or 312 can quickly discharge the ESD currents $I_1$ or $I_2$. Besides, since the structure of the first transistor set 310 is formed by the triple CMOS well process, the parasitic capacitance within the NPN bipolar transistor 311 or 312 is also smaller than that of the conventional diode.

In summary, the ESD protection mechanism of the invention has a smaller leakage current, a higher breakdown voltage, a higher capability for driving current, and a smaller parasitic capacitance. In addition, the ESD protection circuit can effectively isolate the different voltage terminals and quickly discharge the large ESD current. Furthermore, the signal between the internal circuits will not be easily affected due to the smaller parasitic capacitance.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An ESD (electrostatic discharge) circuit for protecting a first internal circuit and a second internal circuit from an electrostatic charge, the first internal circuit coupled between two terminals VDD1 and VSS1 and the second internal circuit coupled between two terminals VDD2 and VSS2, the ESD circuit comprising:
   a first transistor set comprising at least one transistor coupled between VDD1 and VDD2;
   a first detecting circuit coupled between VDD1 and VSS1 for detecting the electrostatic charge, and coupled to the first transistor set;
   a second detecting circuit coupled between VDD2 and VSS2 for detecting the electrostatic charge, and coupled to the first transistor set; and
   a second transistor set comprising at least one transistor coupled between VSS1 and VSS2;
   wherein if the first detecting circuit or the second detecting circuit detects the electrostatic charge injected into the VDD1 or the VDD2, the first transistor set is turned on to discharge the electrostatic charge;
   wherein if the first detecting circuit or the second detecting circuit detects the electrostatic charge injected into the VDD1 or the VDD2, the second transistor set is turned on to discharge the electrostatic charge.

2. The ESD circuit of claim 1, wherein the first transistor set comprises:
   a first transistor coupled between the VDD1 and the VDD2, and coupled to the first detecting circuit; and
   a second transistor coupled between the VDD1 and the VDD2, and coupled to the second detecting circuit;
   wherein if the first detecting circuit detects the electrostatic charge injected into the VDD1, the first transistor is turned on to discharge the electrostatic charge, and if the second detecting circuit detects the electrostatic charge injected into the VDD2, the second transistor is turned on to discharge the electrostatic charge.

3. The ESD circuit of claim 1, wherein the electrostatic charge injected into the VDD1 is discharged to the VSS1 through the first detecting circuit, to the VDD2 through the first transistor set, or to the VSS2 through the first transistor set and the second detecting circuit.

4. The ESD circuit of claim 1, wherein the electrostatic charge injected into the VDD2 is discharged to the VSS2 through the second detecting circuit, to the VDD1 through the first transistor set, or to the VSS1 through the first transistor set and the first detecting circuit.

5. The ESD circuit of claim 1, wherein the first transistor set comprises at least a bipolar junction transistor (BJT).

6. The ESD circuit of claim 1, wherein the first transistor set comprises the transistor having:
   a first electrode coupled to the VDD1;
   a first insulator surrounding the first electrode;
   a second electrode surrounding the first insulator and coupled to the first electrode;
   a second insulator surrounding the second electrode; and
   a third electrode surrounding the second insulator and coupled to the second electrode and the VDD2.

7. The ESD circuit of claim 1, wherein the electrostatic charge injected into the VDD1 is discharged to the VSS2 through the first detecting circuit and the second transistor set.

8. The ESD circuit of claim 1, wherein the electrostatic charge injected into the VDD2 is discharged to the VSS1 through the second detecting circuit and the second transistor set.

9. The ESD circuit of claim 1, wherein the second transistor set comprises:
   a third transistor coupled between the VSS1 and the VSS2, and coupled to the first detecting circuit; and
   a fourth transistor coupled between the VSS1 and the VSS2, and coupled to the second detecting circuit;
   wherein if the first detecting circuit detects the electrostatic charge injected into the VDD1, the third transistor is turned on to discharge the electrostatic charge, and if the second detecting circuit detects the electrostatic charge injected into the VDD2, the fourth transistor is turned on to discharge the electrostatic charge.

10. The ESD circuit of claim 1, wherein the second transistor set comprises at least a bipolar junction transistor (BJT).

11. The ESD circuit of claim 1, wherein the second transistor set comprises the transistor having:
   a first electrode coupled to the VSS1;
   a first insulator surrounding the first electrode;
   a second electrode surrounding the first insulator and coupled to the first electrodeb;
   a second insulator surrounding the second electrode; and
   a third electrode surrounding the second insulator and coupled to the second electrode and the VSS2.

12. The ESD circuit of claim 1, wherein at least one of the first detecting circuit and second detecting circuit comprises:
   a detector coupled to the first transistor set and turning on the first transistor set during the occurrence of the electrostatic charge; and
   a discharging circuit coupled to the detector for discharging the electrostatic charge.

13. The ESD circuit of claim 1, further comprising at least one first diode coupled between the VDD1 and VSS1, wherein the electrostatic charge injected into the VSS1 may be discharged through the first diode.

14. The ESD circuit of claim 1, further comprising at least one second diode coupled between the VDD2 and VSS2, wherein the electrostatic charge injected into the VSS2 may be discharged through the second diode.

15. An ESD (Electrostatic Discharging) protection method for protecting a first internal circuit and a second internal circuit from an electrostatic charge, the first internal circuit coupled between two terminals VDD1 and VSS1 and the second internal circuit coupled between two terminals VDD2 and VSS2, the method comprising the following steps:
   disposing a first transistor set comprising at least one transistor coupled between the VDD1 and the VDD2;
   using a first detecting circuit and a second detecting circuit for detecting the electrostatic charge, wherein the first detecting circuit is coupled between the VDD1 and the VSS1, and the second detecting circuit is coupled between the VDD2 and the VSS2; and
   disposing a second transistor set comprising at least one transistor coupled between VSS1 and VSS2;
   when the first detecting circuit or the second detecting circuit detects the electrostatic charge injected into the VDD1 or the VDD2, turning on the first transistor set to discharge the electrostatic charge;
   when the first detecting circuit or the second detecting circuit detects the electrostatic charge injected into the VDD1 or the VDD2, turning on the second transistor set to discharge the electrostatic charge.

16. The ESD protection method of claim 15, wherein the first transistor set comprises:
   a first transistor coupled between the VDD1 and the VDD2, and coupled to the first detecting circuit; and
   a second transistor coupled between the VDD1 and the VDD2, and coupled to the second detecting circuit;
   wherein if the first detecting circuit detects the electrostatic charge injected into the VDD1,the first transistor is turned on to discharge the electrostatic charge, and if the second detecting circuit detects the electrostatic charge injected into the VDD2, the second transistor is turned on to discharge the electrostatic charge.

17. The ESD protection method of claim 15, wherein the first transistor set comprises at least a bipolar junction transistor (BJT) comprising:
   a first electrode coupled to the VDD1;
   a first insulator surrounding the first electrode;
   a second electrode surrounding the first insulator and coupled to the first electrode;
   a second insulator surrounding the second electrode; and
   a third electrode surrounding the second insulator and coupled to the second electrode and the VDD2.

18. An ESD (electrostatic discharge) circuit for protecting a first internal circuit and a second internal circuit from an electrostatic charge, the first internal circuit coupled between two terminals VDD1 and VSS1 and the second internal circuit coupled between two terminals VDD2 and VSS2, the ESD circuit comprising:
   a first transistor set comprising at least one transistor coupled between VDD1 and VDD2, the transistor having:
      a first electrode coupled to the VDD1;
      a first insulator surrounding the first electrode;
      a second electrode surrounding the first insulator and coupled to the first electrode;
      a second insulator surrounding the second electrode; and
      a third electrode surrounding the second insulator and coupled to the second electrode and the VDD2;
   a first detecting circuit coupled between VDD1 and VSS1 for detecting the electrostatic charge, and coupled to the first transistor set; and
   a second detecting circuit coupled between VDD2 and VSS2 for detecting the electrostatic charge, and coupled to the first transistor set;
   wherein if the first detecting circuit or the second detecting circuit detects the electrostatic charge injected into the VDD1 or the VDD2, the first transistor set is turned on to discharge the electrostatic charge.

19. The ESD circuit of claim 18, wherein the first transistor set comprises at least a bipolar junction transistor (BJT).

* * * * *